United States Patent
Yu et al.

(10) Patent No.: US 11,842,888 B2
(45) Date of Patent: Dec. 12, 2023

(54) REMOVING METAL CONTAMINATION FROM SURFACES OF A PROCESSING CHAMBER

(71) Applicant: Lam Research Corporation, Fremont, CA (US)

(72) Inventors: Jengyi Yu, San Ramon, CA (US); Samantha SiamHwa Tan, Newark, CA (US); Seongjun Heo, Dublin, CA (US); Ge Yuan, Fremont, CA (US); Siva Krishnan Kanakasabapathy, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/091,550

(22) Filed: Dec. 30, 2022

(65) Prior Publication Data

US 2023/0148265 A1     May 11, 2023

Related U.S. Application Data

(62) Division of application No. 17/278,750, filed as application No. PCT/US2019/054477 on Oct. 3, 2019, now abandoned.

(60) Provisional application No. 62/741,754, filed on Oct. 5, 2018.

(51) Int. Cl.
*C23C 16/44* (2006.01)
*H01J 37/32* (2006.01)

(52) U.S. Cl.
CPC .... *H01J 37/32862* (2013.01); *C23C 16/4405* (2013.01)

(58) Field of Classification Search
CPC ............ H01J 37/32862; H01J 37/3288; C23C 16/4405; C21C 5/441; C21C 5/4693; B23K 10/003
See application file for complete search history.

(56) References Cited

U.S. PATENT DOCUMENTS

| | | | |
|---|---|---|---|
| 2008/0035170 A1* | 2/2008 | Baek | ............... B08B 7/0035 134/107 |
| 2020/0051807 A1* | 2/2020 | Singhal | ............. H01J 37/32449 |

* cited by examiner

*Primary Examiner* — Erin F Bergner

(57) ABSTRACT

A method for cleaning surfaces of a substrate processing chamber includes a) supplying a first gas selected from a group consisting of silicon tetrachloride ($SiCl_4$), carbon tetrachloride ($CCl_4$), a hydrocarbon ($C_xH_y$ where x and y are integers) and molecular chlorine ($Cl_2$), boron trichloride ($BCl_3$), and thionyl chloride ($SOCl_2$); b) striking plasma in the substrate processing chamber to etch the surfaces of the substrate processing chamber; c) extinguishing the plasma and evacuating the substrate processing chamber; d) supplying a second gas including fluorine species; e) striking plasma in the substrate processing chamber to etch the surfaces of the substrate processing chamber; and f) extinguishing the plasma and evacuating the substrate processing chamber.

24 Claims, 5 Drawing Sheets

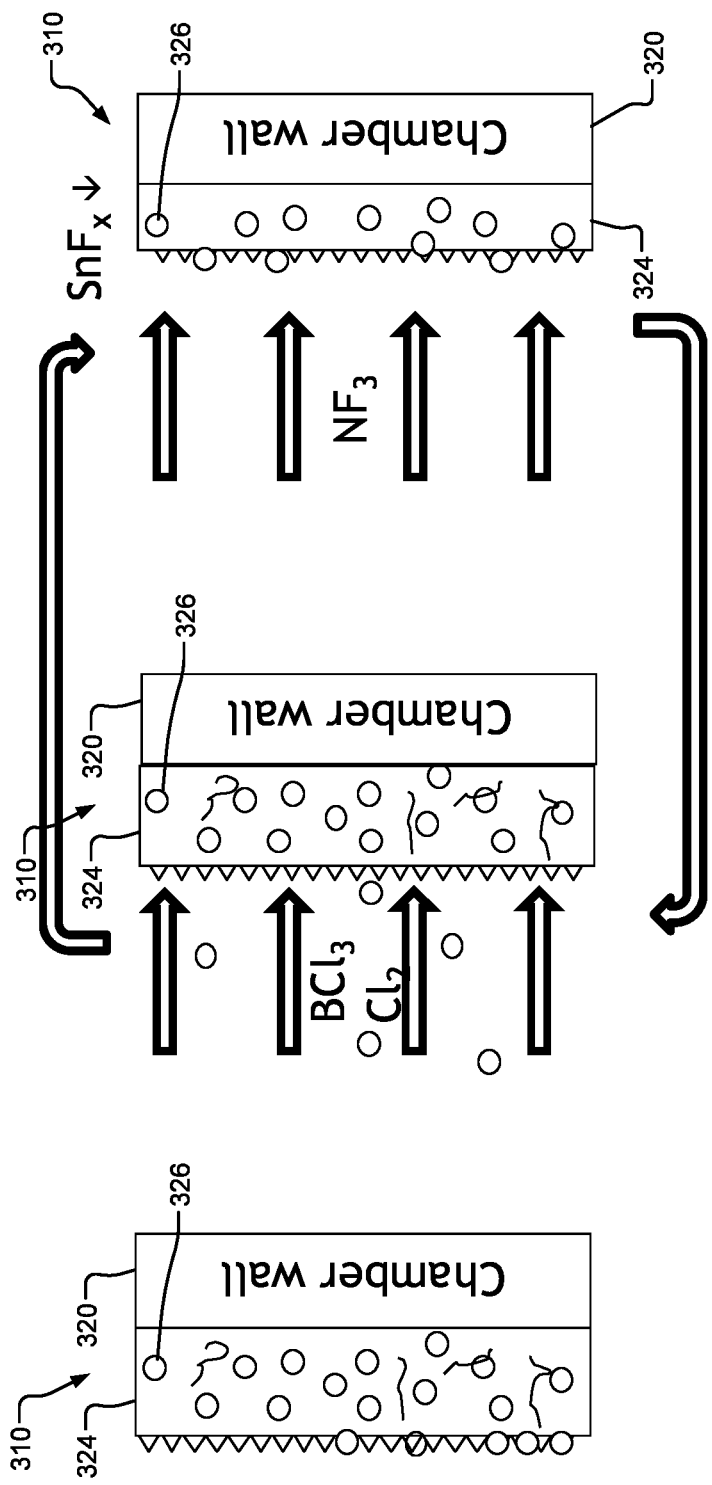

REMOVING METAL CONTAMINATION FROM SURFACES OF A PROCESSING CHAMBER

CROSS REFERENCE TO RELATED APPLICATIONS

The present disclosure is a Division of U.S. application Ser. No. 17/278,750, filed Mar. 23, 2021, which claims the benefit of U.S. National Phase Application under 35 U.S.C. 371 of International Application No. PCT/US2019/054477, filed on Oct. 3, 2019, which claims the benefit of U.S. Provisional Patent Application No. 62/741,754, filed on Oct. 5, 2018. The entire disclosures of the above-identified applications are hereby incorporated by reference in their entirety.

FIELD

The present disclosure relates to substrate processing systems and more particularly to systems and methods for removing metal contamination from surfaces of a processing chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. During processing, a substrate is arranged on a substrate support in a processing chamber. One or more gases are introduced into the processing chamber by a gas delivery system. Plasma may be struck during processing to enhance chemical reactions within the processing chamber. An RF bias may also be supplied to the substrate support to control ion energy.

For example, etching may be performed using inductively-coupled plasma (ICP) generated by inductive coils arranged outside of a processing chamber adjacent to a dielectric window. Process gas flowing inside the processing chamber is ignited to create plasma. RF bias power may also be supplied to an electrode in the substrate support.

During substrate treatment such as deposition or etching, residue may be deposited on surfaces of the processing chamber such as chamber walls. The residue may cause defects during processing of the substrates. Cleaning may be performed to remove the residue.

SUMMARY

A method for cleaning surfaces of a substrate processing chamber includes a) supplying a first gas selected from a group consisting of silicon tetrachloride ($SiCl_4$), carbon tetrachloride ($CCl_4$), a hydrocarbon ($C_xH_y$, where x and y are integers) and molecular chlorine ($Cl_2$), boron trichloride ($BCl_3$), and thionyl chloride ($SOCl_2$); b) striking plasma in the substrate processing chamber to etch the surfaces of the substrate processing chamber; c) extinguishing the plasma and evacuating the substrate processing chamber; d) supplying a second gas including fluorine species; e) striking plasma in the substrate processing chamber to etch the surfaces of the substrate processing chamber; and f) extinguishing the plasma and evacuating the substrate processing chamber.

In other features, the method includes g) repeating a) to c) and d) to f) N times, where N is an integer greater than zero. The second gas is selected from a group consisting of nitrogen trifluoride ($NF_3$), sulfur hexafluoride ($SF_6$), and carbon tetrafluoride ($CF_4$). a) to g) are performed without a substrate located on a substrate support in the substrate processing chamber.

In other features, the method includes pre-coating the surfaces of the substrate processing chamber with a material selected from a group consisting of silicon (Si) and silicon oxide ($SiO_x$) after g).

In other features, a) to c) are performed after d) to f) during each of the N times. a) to c) are performed before d) to f) during each of the N times.

In other features, prior to performing a) to g), the method includes pre-coating the surface of the substrate processing chamber with a material selected from a group consisting of silicon (Si) and silicon oxide ($SiO_x$); and performing a substrate treatment. In other features, the method includes, after g), pre-coating the surface of the substrate processing chamber with a material selected from a group consisting of silicon (Si) and silicon oxide ($SiO_x$); and performing a substrate treatment.

In other features, the substrate treatment comprises etching. The substrate includes tin (Sn).

In other features, the method includes controlling a first pressure in the substrate processing chamber during b) within a first pressure range; and controlling a second pressure in the substrate processing chamber during e) within a second pressure range. The first pressure range is less than the second pressure range.

In other features, the first pressure range is from 1 to 30 mT and the second pressure range is from 30 to 150 mT.

A substrate processing system for treating substrates includes a processing chamber comprising chamber walls and a substrate support. A gas delivery system selectively delivers gases to the processing chamber. A plasma generator selectively generates plasma in the processing chamber. A controller is configured to control the gas delivery system and the plasma generator to a) supply a first gas selected from a group consisting of silicon tetrachloride ($SiCl_4$), carbon tetrachloride ($CCl_4$), a hydrocarbon ($C_xH_y$, where x and y are integers) and molecular chlorine ($Cl_2$), boron trichloride ($BCl_3$), and thionyl chloride ($SOCl_2$); b) strike plasma in the substrate processing chamber to etch the surfaces of the substrate processing chamber; c) extinguish the plasma and evacuate the substrate processing chamber; d) supply a second gas including fluorine species; e) strike plasma in the substrate processing chamber to etch the surfaces of the substrate processing chamber; and f) extinguish the plasma and evacuate the substrate processing chamber.

In other features, the controller is further configured to g) repeat a) to c) and d) to f) N times, where N is an integer greater than zero. The second gas is selected from a group consisting of nitrogen trifluoride ($NF_3$), sulfur hexafluoride ($SF_6$), and carbon tetrafluoride ($CF_4$). The controller is configured to remove a substrate from the substrate support prior to performing a) to g). The controller is configured to pre-coat the surfaces of the substrate processing chamber with a material selected from a group consisting of silicon (Si) and silicon oxide ($SiO_x$) after g). The controller is configured to perform a) to c) after d) to f) during each of the N times. The controller is configured to perform a) to c) before d) to f) during each of the N times.

In other features, the controller is configured to, prior to performing a) to g), pre-coat the surface of the substrate processing chamber with a material selected from a group consisting of silicon (Si) and silicon oxide ($SiO_x$); and perform a substrate treatment. After g), the controller is configured to pre-coat the surface of the substrate processing chamber with a material selected from a group consisting of silicon (Si) and silicon oxide ($SiO_x$); and perform a substrate treatment.

In other features, the substrate treatment comprises etching. The substrate includes tin (Sn).

In other features, the controller is configured to control a first pressure in the substrate processing chamber during b) to a first pressure range; and control a second pressure in the substrate processing chamber during e) to a second pressure range. The first pressure range is less than the second pressure range.

In other features, the first pressure range is from 1 to 30 mT and the second pressure range is from 30 to 150 mT.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 3A to 3E illustrate another example of cleaning of surfaces of the substrate processing system according to the present disclosure.

In the drawings, reference numbers may be reused to identify similar and/or identical elements.

DETAILED DESCRIPTION

Figure 1:
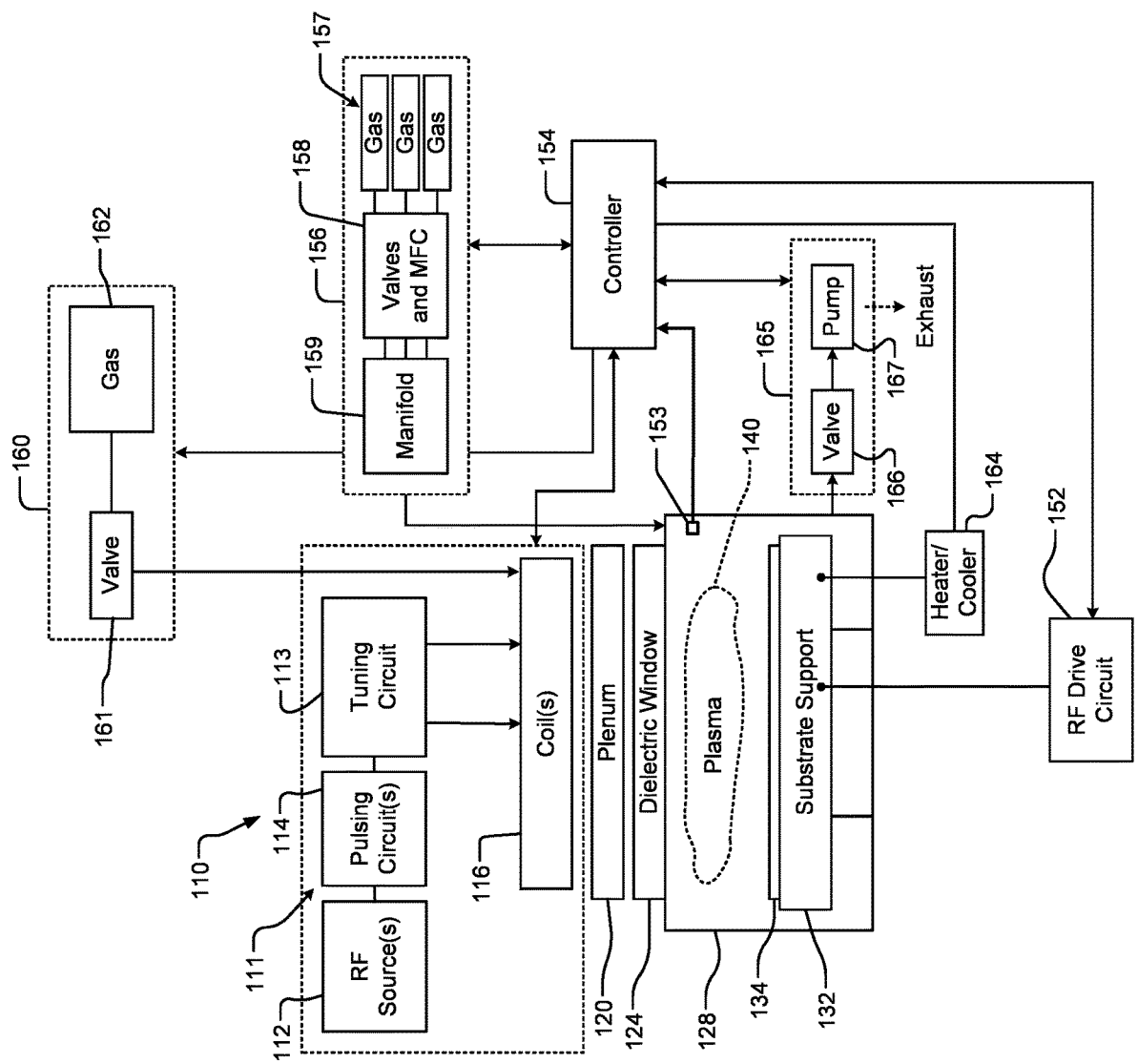
FIG. 1 is a functional block diagram of an example of a substrate processing system that includes a cleaning system according to the present disclosure.

The present disclosure relates to systems and methods for cleaning surfaces of a processing chamber such as chamber walls to reduce metal cross-contamination. The cleaning method described herein removes metal contaminants such as Tin (Sn), aluminum (Al), yttrium (Y), iron (Fe), and/or other metals more effectively than traditional cleaning methods. The cleaning systems and methods according to the present disclosure can be used to periodically reset the processing chamber to its original clean state.

Metal contamination in the processing chamber may cause process shift such as etch rate changes. Metal contamination may also cause defects that adversely affect device performance. Typical specifications require metal contamination in the processing chamber to be less than 5 $e^{10}/cm^2$. Traditional chamber cleaning methods result in metal contamination levels of approximately $1e^{11}/cm^2$ to $1e^{12}/cm^2$. The cleaning systems and methods described herein can significantly reduce metal contamination to less than 5 $e^{10}/cm^2$.

For example, surfaces of an inductively coupled plasma processing chamber are typically pre-coated with a layer such as silicon (Si) or silicon oxide ($SiO_x$). After etching of substrates including Sn is performed, tin oxide ($SnO_x$) etch by-product or residue is deposited on the surfaces of the processing chamber. Cleaning may include a first plasma processing step with molecular chlorine ($Cl_2$) and a second plasma processing step with nitrogen trifluoride ($NF_3$). However, this chemistry has a very slow $SnO_x$ etch rate due to non-volatile etch byproducts. In other words, Sn halides ($SnF_x$, $SnCl_x$, and $SnBr_x$) are non-volatile. Even with relatively long etch periods up to 300 seconds, the contamination levels remain at or above $1e^{11}/cm^2$ to $1e^{12}/cm^2$.

Another cleaning approach using molecular hydrogen ($H_2$) plasma etchs Sn or $SnO_x$ to form volatile tin hydride ($SnH_x$). However, $SnH_x$ is not stable at high temperatures and tends to dissociate back to metallic Sn and re-deposit on the surfaces in the processing chamber.

Systems and methods according to the present disclosure are used to clean surfaces in the processing chamber to reduce metal contamination. In some examples, the surfaces of the processing chamber are pre-coated with a layer such as Si or $SiO_x$. The processing chamber is used to process one or more substrates. After removing the substrate from the processing chamber, the systems and methods supply a first gas selected from a group consisting of silicon tetrachloride ($SiCl_4$), a hydrocarbon ($C_xH_y$ where x and y are integers) and molecular chlorine ($Cl_2$), carbon tetrachloride ($CCl_4$), boron trichloride ($BCl_3$), and thionyl chloride ($SOCl_2$). In some examples, an inert gas such as argon (Ar), helium (He), neon ($N_e$), or molecular nitrogen ($N_2$) may also be supplied to dilute the etch gas. Plasma is struck for a first predetermined period and then extinguished.

The first etching step selectively etches Sn relative to Si. A volatile compound $SnR_xO_yCl_z$ is formed (where R=boron (B), carbon (C), sulfur (S), silicon (Si), etc.). After etching, the processing chamber is evacuated and then a second gas including fluorine species is supplied. In some examples, the second gas is selected from a group consisting of nitrogen trifluoride ($NF_3$), sulfur hexafluoride ($SF_6$), and carbon tetrafluoride ($CF_4$). In some examples, an inert gas may also be supplied. Plasma is struck for a second predetermined period. The second etch step selectively etches Si relative to Sn. The ordering of the first and second steps can be reversed.

In some examples, the first and second etch steps are not repeated or are repeated one or more times until the pre-coat layer is fully or substantially removed. After multiple cycles, metal contamination levels can be reduced to less than $1e^{10}/cm^2$. Then, the surfaces of the processing chamber are pre-coated again and the substrate treatments are performed again.

In some examples, the pressure in the processing chamber is adjusted to different pressures during the first step and the second step. In other examples, the pressure in the processing chamber is the same during the first step and the second step. Additional details are described further below.

Referring now to FIG. 1, an example of a substrate processing system 110 according to the present disclosure is shown. While the present disclosure will be described in the context of an inductively coupled plasma (ICP) processing chamber, other types of processing chambers can be used.

The substrate processing system 110 includes a coil driving circuit 111. A pulsing circuit 114 may be used to pulse the RF power on and off or vary an amplitude or level of the RF power. The tuning circuit 113 may be directly connected to one or more inductive coils 116. The tuning circuit 113 tunes an output of the RF source 112 to a desired frequency and/or a desired phase, matches an impedance of the coils 116 and splits power between the coils 116. In some examples, the coil driving circuit 111 is replaced by one of the drive circuits described further below in conjunction with controlling the RF bias.

In some examples, a plenum 120 may be arranged between the coils 116 and a dielectric window 124 to control the temperature of the dielectric window 124 with hot and/or cold air flow. The dielectric window 124 is arranged along one side of a processing chamber 128. The processing chamber 128 further comprises a substrate support (or pedestal) 132. The substrate support 132 may include an electrostatic chuck (ESC), or a mechanical chuck or other type of chuck. Process gas is supplied to the processing chamber 128 and plasma 140 is selectively generated inside of the processing chamber 128. The plasma 140 etches an exposed surface of the substrate 134. A drive circuit 152 may be used to provide an RF bias to an electrode in the substrate support 132 during operation.

A gas delivery system 156 may be used to supply a process gas such as etch gas, precursor gas, inert gas, etc. to the processing chamber 128. The gas delivery system 156 may include gas sources 157, a gas metering system 158 such as valves and mass flow controllers, and a manifold 159. A gas delivery system 160 may be used to deliver gas 162 via a valve 61 to the plenum 120. The gas may include cooling gas (air) that is used to cool the coils 116 and the dielectric window 124. A heater/cooler 164 may be used to heat/cool the substrate support 132 to a predetermined temperature. An exhaust system 165 includes a valve 166 and pump 167 to remove reactants from the processing chamber 128 by purging or evacuation. The valve 166 and the pump 167 may be used to control pressure in the processing chamber.

A pressure sensor 153 may be used to sense pressure inside of the processing chamber. A controller 154 may be used to control the etching process. The controller 154 monitors system parameters such as temperature and pressure. The controller 154 controls delivery of the gas, striking, maintaining and extinguishing the plasma, removal of reactants, supply of cooling gas, and so on. The controller 154 may control the valve 166 and the pump 167 to vary pressure in the processing chamber. Additionally, as described below in detail, the controller 154 may control the cleaning process described herein.

Figure 2A:
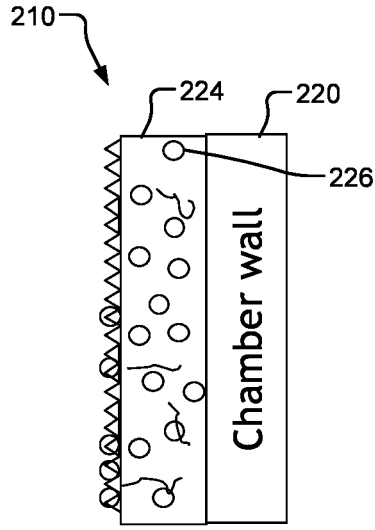
FIGS. 2A to 2D illustrate cleaning of surfaces of the substrate processing system according to the present disclosure.

Referring now to FIGS. 2A to 2D, a surface of a processing chamber 210 is shown during cleaning using the cleaning systems and methods described herein. In FIG. 2A, a surface 220 of the processing chamber 210 such as a chamber wall is shown. Prior to substrate treatment, the surface 220 of the processing chamber 210 may be treated with a pre-coat layer 224. In some examples, the pre-coat layer 224 includes silicon (Si) or silicon oxide ($SiO_x$), although other pre-coat layers 224 can be used.

Figure 2B:
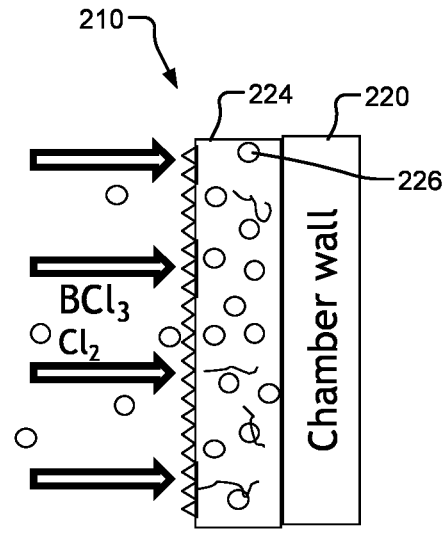

During substrate treatments such deposition or etching, residue 226 contaminates the pre-coat layer 224. For example, $SnO_x$ may be deposited on the pre-coat layer. Steps are taken to remove the residue. In FIG. 2B, a first gas is supplied to the processing chamber 210 and plasma is struck for a first predetermined period and then extinguished. In some examples, the first gas is selected from a group consisting of silicon tetrachloride ($SiCl_4$), carbon tetrachloride ($CCl_4$), a hydrocarbon ($C_xH_y$, where x and y are integers) and molecular chlorine ($Cl_2$), boron trichloride ($BCl_3$), and thionyl chloride ($SOCl_2$). The first gas etches tin (Sn) selectively relative to silicon (Si).

Figure 2C:
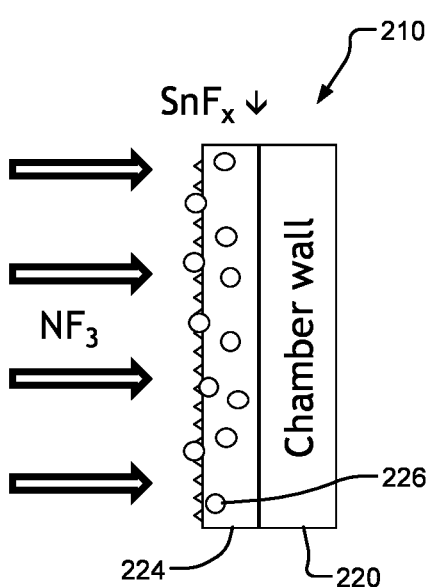

The processing chamber 210 is evacuated after the first predetermined period. In FIG. 2C, a second gas including fluorine species is supplied to the processing chamber 210 and plasma is struck for a second predetermined period and then extinguished. In some examples, the second gas is selected from a group consisting of nitrogen trifluoride ($NF_3$), sulfur hexafluoride ($SF_6$), and carbon tetrafluoride ($CF_4$). The second gas etches Si selectively relative to Sn. In this example, only one cycle is performed.

Figure 2D:
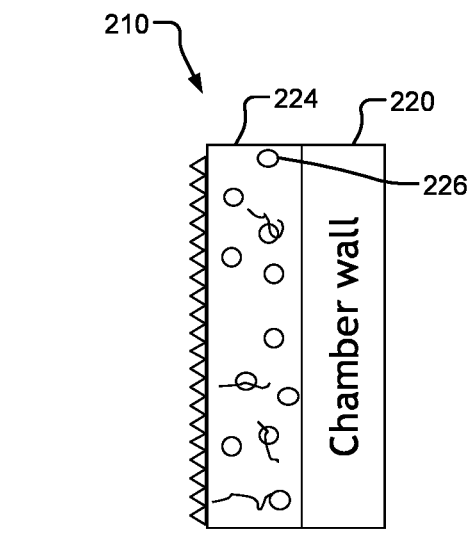

In FIG. 2D, the silicon or silicon oxide ($SiO_x$) pre-coat layer is applied over the remnants of the prior pre-coat layer. For example, a precursor gas such as silicon tetrachloride ($SiCl_4$), silane ($SiH_4$), or other silicon (Si) or silicon oxide ($SiO_x$) precursor gas is supplied for a predetermined period and plasma is struck. In some examples, molecular oxygen ($O_2$) gas is also supplied to the processing chamber. After the pre-coat layer is deposited, substrate treatment can be continued. In some examples, the pre-coat layer is deposited using plasma enhanced chemical vapor deposition (PECVD).

Figure 3D:

Referring now to FIGS. 3A to 3E, surfaces of a processing chamber 310 are shown during cleaning using the cleaning systems and methods described herein. In FIG. 3A, a surface 320 of the processing chamber 310 such as a chamber wall is shown. Prior to substrate treatment, a pre-coat layer 324 may be deposited on the surface 320 of the processing chamber 310. In some examples, the pre-coat layer 324 includes silicon or silicon dioxide, although other types of pre-coat layers 324 can be used.

During substrate treatment (such as during deposition or etching), residue 326 such as Sn or $SnO_x$ contaminates the pre-coat layer 324. To prevent process drift or defects, the contaminated pre-coat layer is etched. In FIG. 3B, a first gas is supplied to the processing chamber 310 and plasma is struck for a first predetermined period. In some examples, the first gas is selected from a group consisting of silicon tetrachloride ($SiCl_4$), carbon tetrachloride ($CCl_4$), boron trichloride ($BCl_3$), a hydrocarbon ($C_xH_y$, where x and y are integers) and molecular chlorine ($Cl_2$), and thionyl chloride ($SOCl_2$). The plasma etches tin (Sn) selectively relative to silicon (Si).

The processing chamber 310 is evacuated after the first predetermined period. In FIG. 3C, a second gas including fluorine species is supplied to the processing chamber 310 and plasma is struck for a second predetermined period. In some examples, the second gas is selected from a group consisting of nitrogen trifluoride ($NF_3$), sulfur hexafluoride ($SF_6$), and carbon tetrafluoride ($CF_4$). The plasma etches Si selectively relative to Sn. The steps shown in FIGS. 3B and 3C can be repeated one or more times. In some examples, the steps are repeated until the pre-coat layer and residuals are removed from the surface.

Figure 3E:
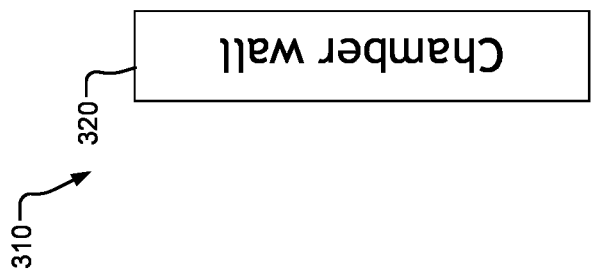

In FIG. 3D, the surface of the processing chamber is shown after removal of the pre-coat layer and residuals. In FIG. 3E, the silicon oxide (SiOx) pre-coat layer is applied again and the processing chamber is ready to perform substrate treatment again.

Figure 4:
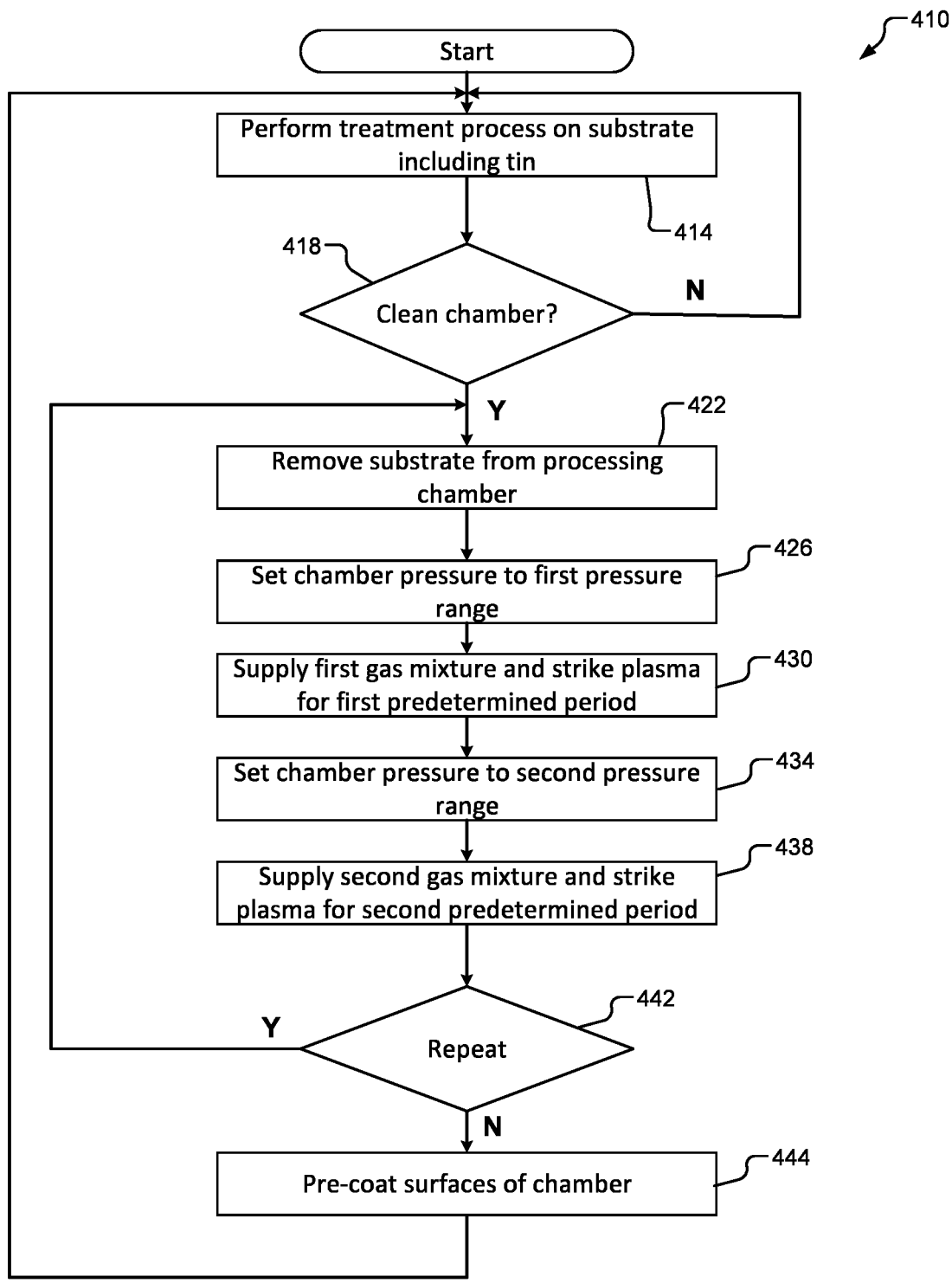
FIG. 4 is a flowchart of an example of a method for cleaning the surfaces the substrate processing system according to the present disclosure.

Referring now to FIG. 4, a method 410 for cleaning surfaces of the substrate processing system is shown. Prior to substrate treatments, a pre-coat layer is applied to surfaces of the processing chamber. At 414, one or more substrate treatments are performed on substrate(s). During the substrate treatments, residue forms on surfaces of the processing chamber. In some examples, the substrate treatment includes deposition, etching, cleaning or other treatment.

At 418, the method determines whether the chamber is to be cleaned. Chamber cleaning can be performed periodically such as every P process cycle (where P is an integer greater than zero), on an event basis (such as when an event occurs), or using other criteria. If chamber cleaning is to be performed at 418, the substrate is removed from the processing chamber at 422 (if needed). At 426, the chamber pressure is set to a first pressure value in a first pressure range. At 430, the first gas (or the second gas) is supplied to the processing chamber and plasma is struck for a first predetermined period. In some examples, the first gas selected from a group consisting of silicon tetrachloride ($SiCl_4$), carbon tetrachloride ($CCl_4$), boron trichloride ($BCl_3$), a hydrocarbon ($C_xH_y$, where x and y are integers) and molecular chlorine ($Cl_2$), and thionyl chloride ($SOCl_2$). In some examples, the second gas is selected from a group consisting of nitrogen trifluoride ($NF_3$), sulfur hexafluoride ($SF_6$), and carbon tetrafluoride ($CF_4$).

At 434, the chamber pressure is set to a second pressure value in a second pressure range. At 438, the second gas (or the first gas) is supplied to the processing chamber and plasma is struck for a second predetermined period. At 442, the process may be repeated one or more times. After the one or more cycles are complete, the surfaces of the processing chamber are pre-coated and then additional substrate treatments can be performed in the processing chamber.

In some examples, the chamber pressure during the chlorine species etch is maintained in a predetermined range from 1 to 30 mT (milliTorr). In other examples, the chamber pressure during the chlorine species etch is maintained in a predetermined range from 4 to 12 mT. In other examples, the chamber pressure during the chlorine species etch is maintained in a predetermined range from 7 to 9 mT. In other examples, the chamber pressure during the chlorine species etch is maintained at 8 mT.

In some examples, the chamber pressure during the fluorine species etch is maintained in a predetermined range from 30 to 150 mT. In other examples, the chamber pressure during the fluorine species etch is maintained in a predetermined range from 50 to 80 mT. In other examples, the chamber pressure during the fluorine species etch is maintained in a predetermined range from 60 to 70 mT. In other examples, the chamber pressure during the fluorine species etch is maintained at 65 mT.

In some examples, the etch periods for the chlorine and fluorine etch species are in a range from 1 to 30 seconds. In some examples, the etch periods for the chlorine and fluorine etch species are in a range from 1 to 10 seconds. In some examples, the etch periods for the chlorine and fluorine etch species are in a range from 3 to 7 seconds. In some examples, the etch periods for the chlorine and fluorine etch species are 5 seconds. As can be appreciated, the etch periods will vary depending upon the processing chamber, concentration of etch gas and type of plasma that is used. Additionally, the etch periods will also vary depending upon the plasma power. Higher plasma will increase the etch rate and decrease the etch periods.

In some examples, the plasma power during the chlorine and fluorine etching is in a range from 100 W to 3000 W. In some examples, the plasma power during the chlorine and fluorine etching is in a range from 500 W to 2500 W. In some examples, the plasma power during the chlorine and fluorine etching is in a range from 1300 W to 2300 W. In some examples, the plasma power during the chlorine and fluorine etching is 1800 W. In some examples, the plasma power during the pre-coat is in a range from 500 W to 2000 W. In some examples, the plasma power during the pre-coat is in a range from 500 W to 1500 W. In some examples, the plasma power during the pre-coat is 1000 W.

In some examples, 100 to 300 standard cubic centimeters (sccm) of gas including chlorine species or fluorine species are supplied during the respective etching steps. In some examples, 200 sccm of gas including chlorine species or fluorine species are supplied during the respective etching steps.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for cleaning surfaces of a substrate processing chamber, comprising:
   a) supplying a first gas selected from a group consisting of silicon tetrachloride ($SiCl_4$), carbon tetrachloride ($CCl_4$), a hydrocarbon ($C_xH_y$, where x and y are integers) and molecular chlorine ($Cl_2$), boron trichloride ($BCl_3$), and thionyl chloride ($SOCl_2$), wherein the first gas is configured to selectively etch tin (Sn) relative to silicon (Si);
   b) striking plasma in the substrate processing chamber with the first gas to selectively etch Sn relative to Si from the surfaces of the substrate processing chamber;
   c) extinguishing the plasma struck in b) and evacuating the substrate processing chamber;
   d) supplying a second gas including fluorine species, wherein the second gas is configured to selectively etch Si relative to Sn;
   e) subsequent to d), striking plasma in the substrate processing chamber with the second gas to selectively etch Si relative to Sn from the surfaces of the substrate processing chamber; and
   f) extinguishing the plasma struck in e) and evacuating the substrate processing chamber.

2. The method of claim 1, further comprising:
   g) repeating a) to c) and d) to f) N times, where N is an integer greater than zero.

3. The method of claim 1, wherein the second gas is selected from a group consisting of nitrogen trifluoride ($NF_3$), sulfur hexafluoride ($SF_6$), and carbon tetrafluoride ($CF_4$).

4. The method of claim 2, wherein a) to g) are performed without a substrate located on a substrate support in the substrate processing chamber.

5. The method of claim 2, further comprising pre-coating the surfaces of the substrate processing chamber with a material selected from a group consisting of silicon (Si) and silicon oxide ($SiO_x$) after g).

6. The method of claim 2, wherein a) to c) are performed after d) to f) during each of the N times.

7. The method of claim 2, wherein a) to c) are performed before d) to f) during each of the N times.

8. The method of claim 2, further comprising:
   prior to performing a) to g):
      pre-coating a surface of the substrate processing chamber with a material selected from a group consisting of silicon (Si) and silicon oxide ($SiO_x$); and
      performing a substrate treatment; and after g):
      pre-coating the surface of the substrate processing chamber with a material selected from a group consisting of silicon (Si) and silicon oxide ($SiO_x$); and
      performing a substrate treatment.

9. The method of claim 8, wherein the substrate treatment comprises etching.

10. The method of claim 9, wherein the substrate includes tin (Sn) and wherein Sn contamination is less than 1e10/cm2 after g).

11. The method of claim 1, further comprising:
controlling a first pressure in the substrate processing chamber during b) within a first pressure range; and
controlling a second pressure in the substrate processing chamber during e) within a second pressure range, wherein the first pressure range is less than the second pressure range.

12. The method of claim 11, wherein the first pressure range is from 1 to 30 mT and wherein the second pressure range is from 30 to 150 mT.

13. A substrate processing system for treating a substrate, comprising:
a processing chamber comprising chamber walls and a substrate support;
a gas delivery system configured to selectively deliver gases to the processing chamber, the gas delivery system comprising a first gas source comprising a first gas and a second gas source comprising a second gas, wherein the first gas is selected from a group consisting of silicon tetrachloride ($SiCl_4$), carbon tetrachloride ($CCl_4$), a hydrocarbon ($C_xH_y$ where x and y are integers) and molecular chlorine ($Cl_2$), boron trichloride ($BCl_3$), and thionyl chloride ($SOCl_2$), wherein the first gas is configured to selectively etch tin (Sn) relative to silicon (Si), and wherein the second gas includes a fluorine species and is configured to selectively etch Si relative to Sn;
a plasma generator configured to selectively generate plasma in the processing chamber; and
a controller programed to perform a processing chamber clean comprising:
a) supplying the first gas;
b) striking plasma in the processing chamber with the first gas to selectively etch Sn relative to Si from surfaces of the processing chamber;
c) extinguishing the plasma struck in b) and evacuating the processing chamber;
d) supplying the second gas;
e) subsequent to d), striking plasma in the processing chamber with the second gas to selectively etch Si relative to Sn from the surfaces of the processing chamber; and
f) extinguishing the plasma struck in e) and evacuate the processing chamber.

14. The substrate processing system of claim 13, wherein the controller is further configured to control the gas delivery system and the plasma generator to:
g) repeat a) to c) and d) to f) N times, where N is an integer greater than zero.

15. The substrate processing system of claim 13, wherein the second gas is selected from a group consisting of nitrogen trifluoride ($NF_3$), sulfur hexafluoride ($SF_6$), and carbon tetrafluoride ($CF_4$).

16. The substrate processing system of claim 14, wherein the controller is configured to control a robot to remove the substrate from the substrate support prior to performing a) to g).

17. The substrate processing system of claim 14, wherein the controller is configured to control the gas delivery system and the plasma generator to pre-coat the surfaces of the processing chamber with a material selected from a group consisting of silicon (Si) and silicon oxide ($SiO_x$) after g).

18. The substrate processing system of claim 14, wherein the controller is configured to control the gas delivery system and the plasma generator to perform a) to c) after d) to f) during each of the N times.

19. The substrate processing system of claim 14, wherein the controller is configured to control the gas delivery system and the plasma generator to perform a) to c) before d) to f) during each of the N times.

20. The substrate processing system of claim 14, wherein the controller is configured to control the gas delivery system and the plasma generator to:
prior to performing a) to g):
pre-coat a surfaces of the processing chamber with a material selected from a group consisting of silicon (Si) and silicon oxide ($SiO_x$); and
perform a substrate treatment; and
after g):
pre-coat the surface of the processing chamber with a material selected from a group consisting of silicon (Si) and silicon oxide ($SiO_x$); and
perform a substrate treatment.

21. The substrate processing system of claim 20, wherein the substrate treatment comprises etching.

22. The substrate processing system of claim 21, wherein the substrate includes tin (Sn) and wherein Sn contamination is less than 5e9/cm2 after g).

23. The substrate processing system of claim 13, wherein the controller is configured to control the gas delivery system and the plasma generator to:
control a first pressure in the processing chamber during b) to a first pressure range; and
control a second pressure in the processing chamber during e) to a second pressure range, wherein the first pressure range is less than the second pressure range.

24. The substrate processing system of claim 23, wherein the first pressure range is from 1 to 30 mT and wherein the second pressure range is from 30 to 100 mT.

* * * * *